United States Patent [19]
Baker et al.

[11] Patent Number: 5,675,287
[45] Date of Patent: Oct. 7, 1997

[54] DIGITAL DC CORRECTION CIRCUIT FOR A LINEAR TRANSMITTER

[75] Inventors: Michael H. Baker, Elmhurst; Paul H. Gailus, Prospect Heights; William J. Turney; Lawrence F. Cygan, both of Schaumburg, all of Ill.

[73] Assignee: Motorola, Inc., Schaumburg, Ill.

[21] Appl. No.: 599,769

[22] Filed: Feb. 12, 1996

[51] Int. Cl.⁶ ........................................ H03G 3/30
[52] U.S. Cl. ..................... 330/129; 330/279; 330/149; 455/126
[58] Field of Search ..................... 330/129, 136, 330/138, 149, 279, 281; 375/296, 297; 435/116, 126

[56] References Cited

U.S. PATENT DOCUMENTS

| | | |
|---|---|---|
| 4,933,986 | 6/1990 | Leitch . |
| 5,066,923 | 11/1991 | Gailus et al. . |
| 5,175,879 | 12/1992 | Ellingson et al. . |
| 5,304,947 | 4/1994 | Carlsson ............................ 330/280 X |
| 5,574,994 | 11/1996 | Huang et al. ...................... 455/126 |
| 5,584,059 | 12/1996 | Turney et al. ...................... 455/126 |

*Primary Examiner*—James B. Mullins
*Attorney, Agent, or Firm*—M. Mansour Chomeshi

[57] ABSTRACT

An amplifier structure (200) includes a main amplifier loop (203) for efficiently amplifying an input signal at a power amplifier (228) coupled to a load susceptible to impedance variations. The amplifier structure (200) includes a DC correction circuit (214) for detecting and correcting misadjustments in the amplifier (200) in order to eliminate DC offset associated therewith.

8 Claims, 5 Drawing Sheets

FIG.1
(PRIOR ART)

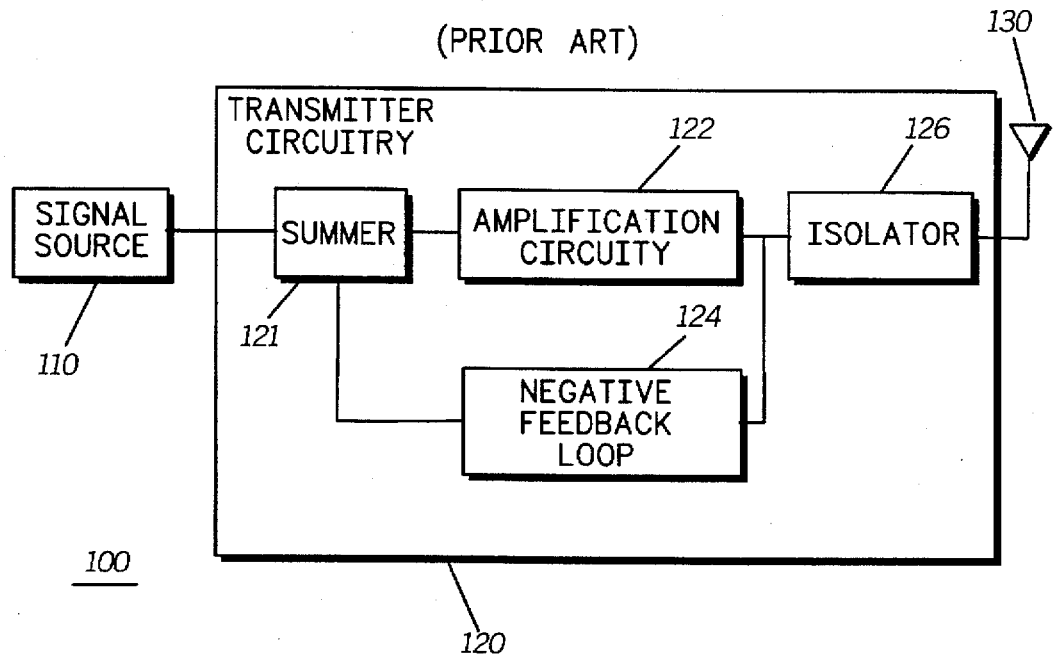

FIG.8

| INPUT SIGNAL QUADRANT 1 | INPUT SIGNAL QUADRANT 2 | INPUT SIGNAL QUADRANT 3 | INPUT SIGNAL QUADRANT 4 | I,Q DC CORRECTION PULSE OUTPUTS |
|---|---|---|---|---|
| Increase attenuation | | Decrease attenuation | | DecreaseI DecreaseQ |
| | Decrease phase | | Increase phase | DecreaseI DecreaseQ |
| | Increase attenuation | | Decrease attenuation | IncreaseI DecreaseQ |
| Increase phase | | Decrease phase | | IncreaseI DecreaseQ |
| | Decrease attenuation | | Increase attenuation | DecreaseI IncreaseQ |
| Decrease phase | | Increase phase | | DecreaseI IncreaseQ |
| Decrease attenuation | | Increase attenuation | | IncreaseI IncreaseQ |
| | Increase phase | | Decrease phase | IncreaseI IncreaseQ |

| INPUT QUADRANT | ERROR Q1 | ERROR Q2 | ERROR Q3 | ERROR Q4 |
|---|---|---|---|---|
| Q1 | DECREASE ATTENUATION | DECREASE PHASE | INCREASE ATTENUATION | INCREASE PHASE |
| Q2 | INCREASE PHASE | DECREASE ATTENUATION | DECREASE PHASE | INCREASE ATTENUATION |
| Q3 | INCREASE ATTENUATION | INCREASE PHASE | DECREASE ATTENUATION | DECREASE PHASE |
| Q4 | DECREASE PHASE | INCREASE ATTENUATION | INCREASE PHASE | DECREASE ATTENUATION |

DIGITAL DC CORRECTION CIRCUIT FOR A LINEAR TRANSMITTER

CROSS REFERENCE TO RELATED APPLICATIONS

This application is related to pending U.S. application Ser. No. 08/599,656, by Baker et al., entitled "METHOD AND APPARATUS FOR AN IMPROVED LINEAR TRANSMITTER," filed concurrently herewith, and assigned to Motorola, Inc.

TECHNICAL FIELD

This invention is generally related to amplifiers and more particularly to linear amplifiers.

BACKGROUND OF THE INVENTION

Radio communication devices use antennas to provide for the efficient transmission of radio frequency communication signals. The transmitter portion of a communication device includes a power amplifier to amplify the radio frequency signals before they are coupled to the antenna for transmission. The power amplifier design often relies upon a constant load impedance in maximizing gain, efficiency, power output level, and other like parameters. The behavior of a transmitter may be affected by its operating environment. For example, a transmitter operating near an electromagnetically reflective structure may be susceptible to energy reflected back through the antenna into the transmitter. Reflective energy may be detrimental to transmitter performance, particularly to the performance of the power amplifier.

To protect against changes in load impedance as a result of reflected energy, an isolator or circulator is often inserted between the antenna and the power amplifier. The isolator protects the power amplifier by absorbing the reflected energy and preventing it from reaching the amplifier. The isolator directs the reflected energy to an absorptive load termination. Although the isolator generally works well, it adds significant cost, size, and weight to the design of a radio communication device. The size of the isolator is particularly prohibitive in low frequency applications where it may reach several cubic inches in size.

Another prior art solution to the problem of reflected energy incorporates a directional coupler to detect the reflected energy and provides a means of adjusting the gain of the power amplifier accordingly. Generally, to minimize the potential of damage to the power amplifier, the gain to the power amplifier is reduced when high levels of reflected energy are present. With this approach, the circuitry for detection of the reflected energy must operate at the transmission frequency. This adds significant cost and complexity to the radio design.

FIG. 1 is a block diagram showing a prior art linear transmitter 100. Linear transmitters, which are typically used in quadrature amplitude modulation (QAM), must provide a predictable response in order to reliably transmit complex base band signals. In the linear transmitter 100, a signal source 110 provides a complex baseband signal to transmitter circuitry 120. Amplification circuitry 122 amplifies the signal for transmission through an antenna 130. As is typical in the prior art, a feedback signal from a negative feedback correction loop 124 is combined with the source signal in a summer 121. The feedback loop is used to improve the linearity of the power amplifier. In so doing, the level of energy transmitted on adjacent channel frequencies, known as splatter, is reduced. Such adjacent channel energy may be disruptive to communication in progress on these channels, hence the need for negative feedback correction. Further included in the prior art transmitter 100 is an isolator 126 situated between the antenna 130 and the remaining transmitter circuitry.

The isolator presents a constant load impedance to the power amplifier irrespective of the impedance presented to the isolator by the antenna. The use of the isolator thereby avoids unpredictable variations in power amplifier gain and phase characteristics which would occur if the antenna were connected directly to the power amplifier. Those skilled in the art will understand that a varying load impedance will cause the power amplifier gain to change, thus altering the effectiveness of the feedback correction loop. Such load variations may also result in phase changes within the power amplifier which may make the feedback loop unstable. Unstable operation may result in severe interference to other communication services and/or the destruction of the linear transmitter. Thus, the isolator protects the power amplifier from load impedance changes and associated reflected energy from the antenna 130 during the transmission.

It is desirable to provide a linear transmitter while avoiding the cost, size, and weight issues associated with isolators. Such a linear transmitter must be capable of rapidly adjusting to changes in the operating environment in order to maintain a stable and linear response while maintaining the efficiency of the power amplifier and without producing misadjustment noise which may result as a result of DC offsets.

BRIEF DESCRIPTION OF THE DRAWINGS

FIG. 1 is a block diagram showing a prior art linear amplifier.

FIG. 7 shows a decision map for the gain phase estimator.

FIG. 8 shows a DC correction table in accordance with the present invention.

DETAILED DESCRIPTION OF THE PREFERRED EMBODIMENT

Figure 2:
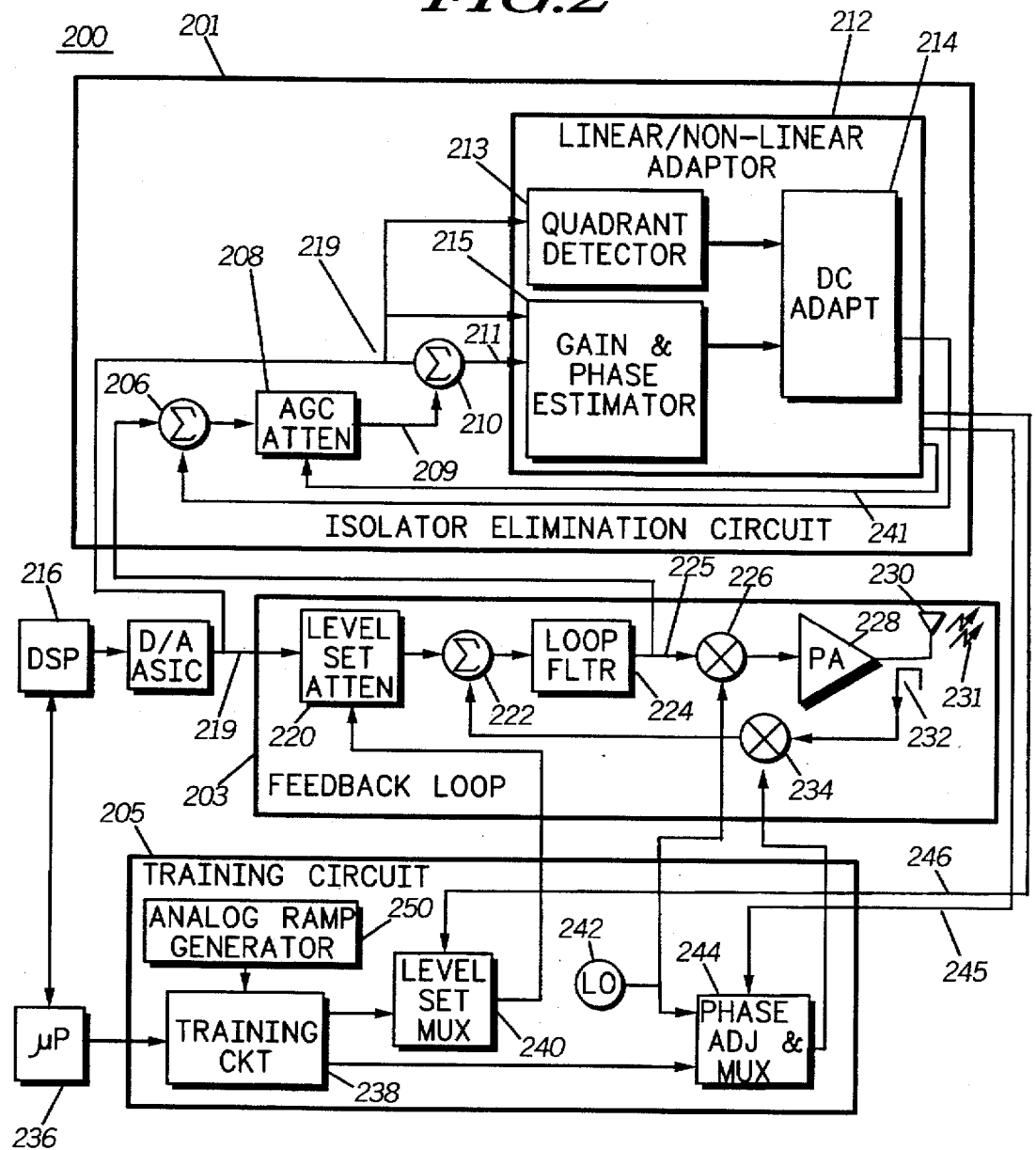
FIG. 2 is a linear transmitter in accordance with the present invention.
Figure 3:
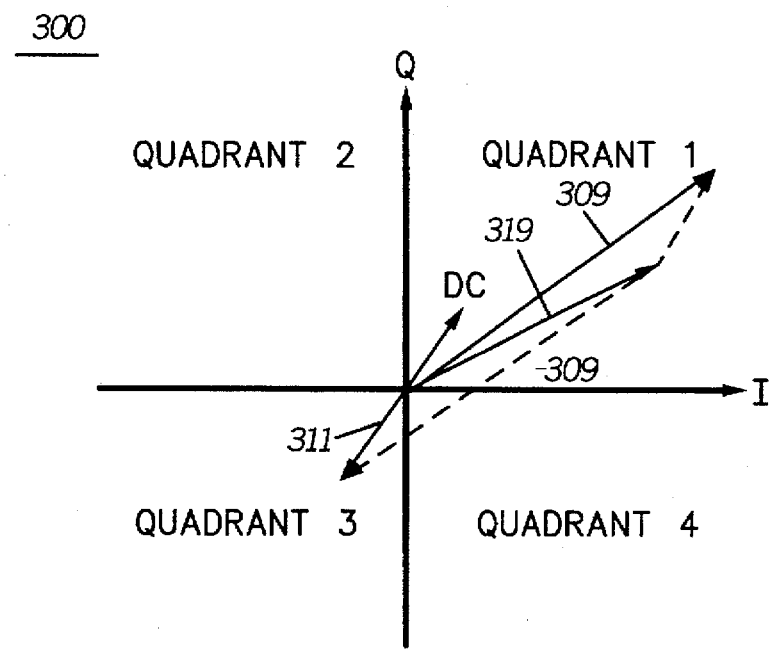
FIG. 3 shows a first example of a vector diagram in accordance with the present invention.

Power amplifiers used in communication devices are designed for optimal operation with a fixed impedance. However, the impedance of an antenna coupled to the power amplifier changes when the antenna is in close proximity of reflective or absorptive objects. An isolator is used in between the power amplifier and the antenna to minimize the effect of load changes on the power amplifier. The weight and size of isolators significantly limit their desirability in today's smaller portable products. To eliminate the isolator, an integrated adaptive circuit continuously tracks and corrects loop gain, phase, and level set changes. To overcome DC offsets which would otherwise cause misadjustments in the adaptive loops, the present invention incorporates a DC correction circuit. A particular benefit of the approach presented herein is that the need for analog integrators is eliminated. Integration of this circuit is therefore greatly reduced in size and cost when no capacitors, which are necessary in the implementation of integrators, are needed.

The principles of the present invention will be better understood by referring to the following description presented in conjunction with a series of drawings where like reference numerals are carried forward.

Referring to FIG. 2, a block diagram of a radio frequency amplifier as part of a linear transmitter 200 in accordance with the present invention is shown. This amplifier may be integrated individually or along with other components of the linear transmitter 200 to produce an integrated circuit suitable for today's cost and space conscious communication devices. A digital signal processor (DSP) 216 represents a signal source. The signal sourced by this processor 216 is converted to analog via a Digital to Analog Converter (D/A) 218 to produce a signal 219. This signal 219 is the input signal to an amplifier feedback loop 203 and an isolator elimination circuit 201. The amplifier feedback loop 203 establishes the main amplifier loop of the present invention. The amplifier feedback loop is a closed loop amplifier structure and preferably a Cartesian feedback loop amplifier. The input signal is a complex digital baseband signal having quadrature components, i.e. In-phase (I) and Quadrature (Q) components. At the feedback loop 203 the input signal is coupled to a level set attenuator 220. The attenuator 220 provides a modulated reference signal which is coupled to a summing junction 222. The summer 222 combines this reference signal with a signal fed back from the output of the loop 203 to provide an error signal as input to a loop filter 224. The filtered error signal 225 is up-converted at a mixer 226 to radio frequency (RF) to produce a drive signal. This drive signal is then applied to a Power Amplifier (PA) 228 for amplification. The amplified signal is transmitted via an antenna 230 to produce transmit signal 231. This antenna 230 establishes the environmentally variable load for the PA 228. The adapter 212 aims to minimize performance degradation of the transmitter 200 in the presence of antenna interferences.

A sample of the amplified signal is fed back to the summer 222 via a coupler 232 and a down-converter at mixer 234. The filtered error signal 225 is also coupled to a summing junction 206 where it is combined with the output signal from a DC adapter 214. The error signal at the output of the summer 206 is applied to an AGC attenuator circuit 208. The attenuator circuit 208 receives a control signal 241 from a linear/non-linear adapter 212. This control signal 241 is used to selectively alter the signal 209 before it is applied to a summing junction 210. At this junction 210 the signal 219 is summed to the output 209 of the AGC attenuation circuit 208 to produce an error signal 211. This error signal 211 is applied to a gain and phase estimator 215. Two outputs, 245 and 246, from the adapter 212 are fed back to circuits in the training block 205 to form an auxiliary loop capable of controlling the operation of the PA 228 both in the linear and non-linear mode for best performance.

In the preferred embodiment, initial level set adjustment for the attenuator 220 and phase shift adjustment for mixers 226 and 234 are provided by the training loop 205. After the transmitter 200 powers up, the training circuitry 205 injects external signals into the main loop 203 and does an initialization train. The initialization train sets feedback loop phase to avoid unstable operation. The initialization train also adjusts level set attenuator 220 to a value which avoids overdriving power amplifier 228. This latter action avoids adjacent channel interference. Upon completion of the initialization train, the isolator elimination circuit 201 through the auxiliary loop takes over the job of adjusting loop phase and level setting, hence making continuous transmission possible.

In general, a training waveform is normally transmitted at the beginning of a transmission, but may also be transmitted during transmission depending upon the communication protocol. The training waveform provides a test signal for circuitry which adjusts modulation levels and loop phase. Proper adjustment of the attenuation setting of block 220 avoids power amplifier clipping, which is responsible for adjacent channel interference, otherwise known as splatter. Proper loop phase adjustment is necessary to prevent loop instability and also reduce adjacent channel splatter. A more detailed description of the training waveform methodology can be found in U.S. Pat. No. 5,066,923, issued to Gailus et al. on Nov. 19, 1991, titled Linear Transmitter Training Method and Apparatus, and assigned to Motorola, Inc. A summary of the operation of this circuit follows.

The training block 205 includes a training circuit 238 which is in communication with the DSP 216 via a microprocessor 236. The training circuit 238 works in conjunction with analog ramp generator 250 and signals generated by the DSP 216 to accomplish level set adjustments at a level adjust circuit 240 and phase adjustments at a phase adjust circuit 244.

The level set adjust circuit 240 disconnects the DSP 216 from the forward path and connects an analog ramp generator 250 in its place. The ramp generator 250 then starts ramping up its output linearly resulting in a corresponding ramping of the transmitter's RF output. The level adjust 240 continues increasing the ramp until a clip threshold is exceeded at the loop summer 222. At clip detection, the voltage at the ramp generator circuit 250 is sampled and held. The ramp output is then allowed to decay. While this is occurring, the DSP 216 sends a DC signal of maximum signal amplitude. Within the level set circuit, the sampled ramp signal and the maximum DSP signal are compared. A successive approximation routine (SAR) adjusts the level set attenuator until these two signals have identical values. When this process is completed, a constant attenuation level is added to the level set attenuator. The final level set attenuator value is such that modulation signal peaks drive the PA approximately 0.5 dB into gain compression—an optimal setting.

A local oscillator 242 provides a signal to the mixer 226 and the phase adjust 244. The phase adjust circuit 244 ensures that the transmit loop is stable. For the system to be stable, it is necessary that the loop provide negative feedback. The phase adjust circuit 244 opens the loop, injects signals and adjusts the phase of the two inputs of summer 222 until they are out of phase.

After opening the loop, a positive signal is sent on the I channel and no signal on the Q channel. If there is negative feedback, the feedback signal would be a negative signal on the I channel and no signal on the Q channel. The angle (on the I—Q plane) can be adjusted by adjusting the phase of the LO of the quadrature down-mixer 234. Phase is adjusted by using a successive approximation routine (SAR) to make increasingly finer adjustments to the phase of the LO to minimize the magnitude of the down-path Q channel.

The above training routine, solves the problem of optimally setting the level set attenuator 220 and loop phase shifter. However, this technique causes adjacent channel splatter and requires that the information to be transmitted be interrupted periodically so training waveforms can be sent through the transmitter. Interrupting the transmission for training is undesirable for systems that are continuous transmission (non-TDMA) such as CDMA and FDMA. To avoid this problem and in accordance with the present invention, this training is only used at initial power up of the transmitter 200. After power up, the adapter 212 takes over the training functions. These adapters use the DSP data as their input and thus enable the use of continuous transmission systems.

A sample of the I and Q signals from the D/A 218 is coupled to a quadrant detector 213 which is a component of an adapter 212. The detector 213 detects the quadrant in which the signal is located. The output of this detector 213 is coupled to the DC adapter 214. The Adapter 212 utilizes a plurality of amplitude thresholds or signal windows to categorize the input signal in several groups; first, second, and third. The first signal or first time window corresponds to a medium signal. The second signal or second time window corresponds to a big or large signal, while the third time window is opened when a small signal is present. Occurrences of these three signals produce time gates during which different activities take place in order to adapt the PA 228 input signals to the variations in the impedance presented thereto via the antenna 230. In other words, the presence of a large signal could be thought of having opened a time gate associated thereto. Similarly, time gates are opened when medium or small signals are detected. It is during these several time gates that various activities by the adapter 212 are taken place. In the preferred embodiment, a big signal is defined to have occurred when the input signal is between 1 and 1.2 dB below its peak level. A medium range corresponds to input signals that are at least 15 dB below peak.

The time gate opened by a medium signal is used to establish performance parameters for the amplifier loop 203. The parameters include phase and amplitude which are calibrated during this window. The time gate opened by a big signal is used to set the operation of the PA 228 in the nonlinear mode. In this mode, the operating point of the PA 228 is set for optimum performance. The phase changes that result when compression takes place during a big signal are compensated for via adjusting the amplitude of the amplifier feedback loop. It is known that the efficiency of an amplifier is directly related to its operation in the nonlinear mode. Optimal efficiency is maintained, while the load varies, by adjusting the PA drive level to achieve a given level of compression. The adapter 212 accomplishes this objective utilizing the big signal time gate. Specifically, the adapter 212 monitors signal compression and adjusts signal compression according to the level of the input signal. Time intervals defined by small signals are used to adjust the weights of the adapter 212. Updates are performed during small signal intervals to avoid or minimize adjacent channel interference which would otherwise occur if adjustments were to take place during medium or big signals.

The complex modulation at the transmitter input, signal 219, rotates through all four quadrants in the Euclidean coordinate system. The gain phase estimator monitors the quadrant to make decisions for controlling attenuation through the AGC circuit 208 and the level set circuit 220. Decisions are also made for controlling the phase adjust circuit 244. FIG. 7, shows the decisions mapped by the gain phase estimator. For a given input quadrant shown in column 1 and a given error quadrant shown in row 1, the proper decision can be deduced. In a co-filing of this invention, the adapter 212 includes a magnitude detector to sort signals by size. Larger signals create time gates for turning on a non-linear adapter which uses the gain phase estimator 215 to generate corrections in the level set attenuator 220. Smaller signals create time gates for turning on a linear adapter which uses the gain phase estimator to generate AGC attenuator 208 and phase adjust circuit 244 corrections.

As stated, during the time gate opened by the presence of a big signal, the algorithm used in the adapter 212 directs the level adjust 240 to alter the setting of the attenuator 220. The algorithm used in this adapter 212 is similar to sign-sign least mean square (SSLMS). This is a reduced form of LMS that requires only the sign of the error and the sign of the input signal to estimate gain and phase. The gain/phase estimator 215 is designed such that its digital outputs can be used in a DC adapt circuit 214 to estimate DC offsets. An example of the algorithm is given in the following paragraph.

Figure 4:
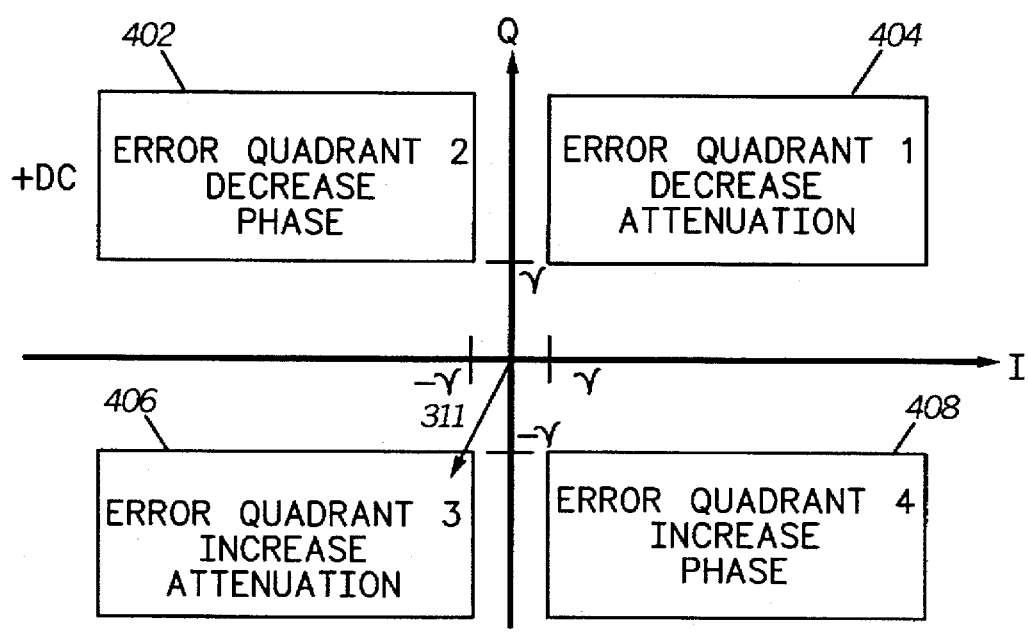
FIG. 4 shows a first example of an error signal on an IQ plot in accordance with the present invention.

The vector diagram 300 shows the case where a DC error exists between vectors 309 and 319 representing signals 209 and 219 respectively on FIG. 2. For a complex IQ signal, its sign can be broken down into the sign of its I channel and the sign of its Q channel. There are four combinations which can be represented by the four Euclidean quadrants as shown by the quadrants of the vector diagram 300. In the specific example under discussion here vectors 309 and 319 both lie in quadrant 1. Vectorally subtracting vector 309 from 319 results in the vector error signal 311. The error signal's sign can also be represented by its quadrants. Referring to FIG. 4, the error signal 311 is shown plotted on an IQ plot 400, with thresholds 402–408 marking the regions of gain and phase errors. For the case described above, vector 309 was larger than 319. This results in an error signal 311 that is in quadrant 3 and exceeds the I and Q detection thresholds. For inputs in quadrant 1 and errors in quadrant 3 exceeding the detection thresholds, the attenuation must be increased to drive the error to zero. This region 406 is marked increase attenuation. Regions 402, 404, and 408 are the detection regions for phase changes and decrease attenuation based on the sign (quadrant) of the error signal. The plot 400 shows the fate of the error vector 311 representing error signal 211 which happens to fall in the region 406. Other vectors are treated according to the regions in which they occur. For the adapter 212, these thresholds are fixed levels.

Figure 5:
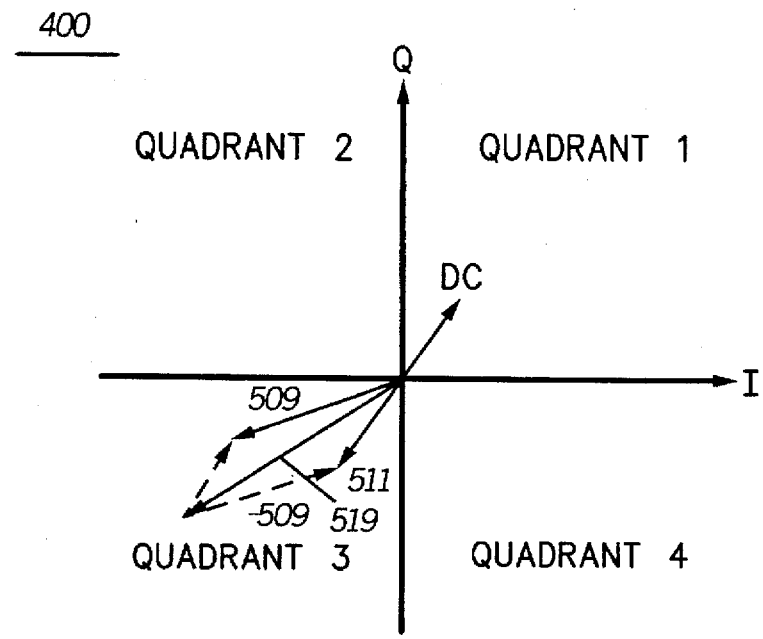
FIG. 5 shows a second example of a vector diagram in accordance with the present invention.
Figure 6:
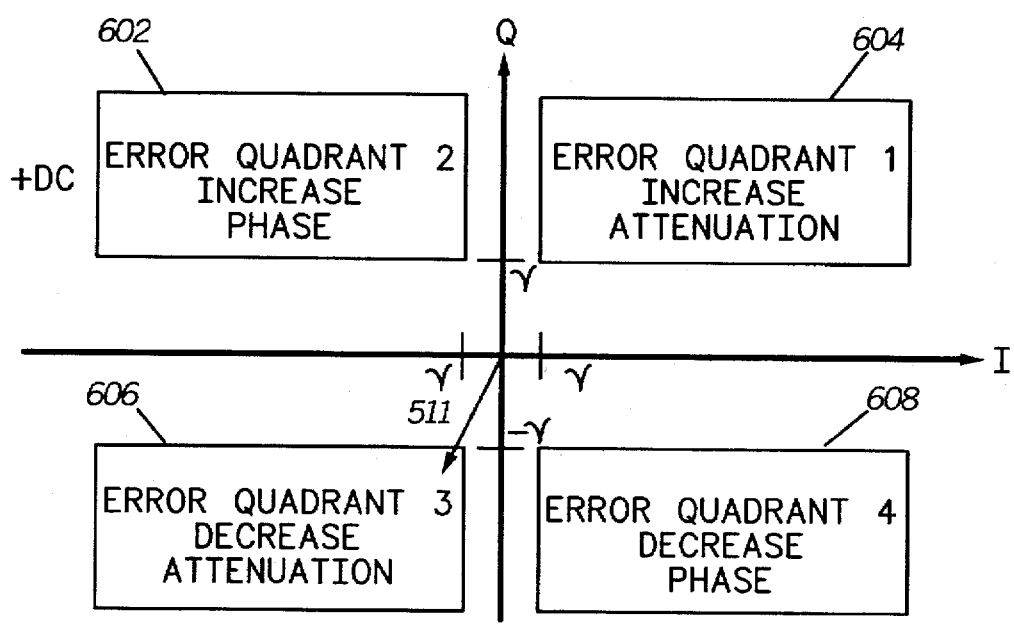
FIG. 6 shows a second example of an error signal on an IQ plot in accordance with the present invention.

Now referring to FIGS. 5 and 6 a second vector diagram 500 and a second error IQ plot 600 are shown, respectively. Vectors 509 and 519 refer to signals respectively in FIG. 2. For diagram 500, the input signal 209 and loop signal 219 have rotated into quadrant 3. Now, for the same I and Q DC offsets as used previously, the DC offset has the opposite effect on vector 509. Signal 209 is now smaller than vector 519. The resultant error signal 211 represented by vector 511 remains in the third quadrant. However, since the input signal 209 has rotated quadrants, errors in quadrant 3 are no longer interpreted as increase attenuation. Row 3 and column 3 of FIG. 7 show that the gain and phase detector will now request a decrease attenuation on the AGC control line 241. The combination of input signals in opposite quadrants requesting opposite types of gain or phase corrections means we have a DC offset. FIG. 8 shows how to map the dual combination of input signals and gain/phase detector decision to DC corrections. The first row of FIG. 8 shows that when the input signal is in quadrant 1 with the detector requesting increase attenuation and at some later time, the input moves to quadrant 3 and the detector requests decrease attenuation then DC correction must be implemented. From row 1, we see that the proper compensation is to incrementally apply negative voltages to compensate the I and Q error signal. As the result of this incremental adjustment the DC offset is reduced and hence misadjustments in the adaptive loop is minimized.

For the type of modulation used in the preferred embodiment the probability of signals in the medium region is much greater than the probability of signals in the big region. Thus, linear estimation and correction occurs much more often than level set (non-linear) correction. During the time gate opened by a medium signal, the linear adaptive algorithm holds the error signal between signals 209 and 219 near zero in the medium region. This zero error provides a reference for the entire system. When a big event occurs at the input signal 219, the algorithm can determine if the big signal caused gain compression, phase compression, phase expansion, gain expansion, or no error at the input of the mixer 226. The adapter 212 adjusts the level of attenuation at the attenuator 220 to keep the transmitter output signal 231 near compression. The peak signals at 231 are preferably maintained at approximately 0.5 dB compression which is adequate to maintain some level of compression for enhanced efficiency without sacrificing a great deal of linearity.

Another function of the adapter 212 is to calibrate the amplitude and phase of the transmitter 200 using medium level signals. In other words, it establishes some performance parameters for the transmitter 200 and in turn gives a sense to its non-linear adapter section as to where the gain of the AGC 208 is with regard to a medium signal. Once calibrated, the large signals are flagged and then compared with the output of the AGC attenuator 208 to see if they are within a desired threshold. If not, the adapter 212 directs the level adjustment circuit 240 to alter the attenuator 220 to change the amplitude of the signal in order to move the output of the PA 228 to the desired area of the gain and phase curve knee. The methods used in the prior art could not distinguish between low level gain variations in the PA and changes in the compression point of the PA. As a result, a suboptimal tradeoff is experienced between PA efficiency and adjacent channel interference.

A significant aspect of the present invention deals with reducing or eliminating misadjustment noise which results from DC offsets between the transmitter input signal 219 and the transmitter forward path point 225. This is a significant benefit of the present invention as presently available adapters do not solve this significant concern. In general, baseband DC offsets are available at the signal point 225. Since a sample of this signal is coupled to the circuit 201, attempts must be made to minimize the effect of these DC offsets on the performance of the transmitter 200. In general, these DC offsets are small enough that their effect on the accuracy of the various components of the adapter 212 is virtually unnoticeable when the errors caused by the antenna environment are large. However, as the adapters compensate for the effects of the environment on the antenna 230, the adaptive weights approach steady state. With the weights near steady state, the gain and phase detectors inside the adapter 212 become very sensitive to the DC offsets between the signals 219 and 209. When DC differences between these two points 219 and 209 exceed the error threshold windows, the gain and phase detectors associated with the linear segments of the adapter 212 begins raising on the gain and phase correction lines 241 and 245, respectively. This raising is symmetrical in the IQ plane so it does not significantly decrease the tracking accuracy. However, the falsing adds misadjustment AM (Amplitude Modulation) and PM (Phase Modulation) noise that is passed directly to the antenna 230. This noise on the detector outputs increases the adjacent channel interference of the transmitter.

In the preferred embodiment, these DC offsets are correlated with the gain and phase misadjustment correction pulses. In accordance with the present invention, the DC adapter 214 uses this correlation to track and remove I and Q channel DC offsets. In this preferred embodiment, typical offsets of 20 mV at the signal point 225 are removed in approximately 10 ms.

In general, the DC adapter 214 removes DC offsets from the adapter 212. The linear adaptive algorithm creates gain and phase correction pulses as the signal moves through all four quadrants of the IQ plane. DC offsets cause gain and phase biases in the correction for a given quadrant. Since diagonal quadrants have opposite gain and phase biases, the DC correction circuit 214 looks at diagonal quadrants to see if they are requesting opposite types of corrections. For example, if positive DC offsets exist on both I and Q, a four quadrant gain/phase detector will produce extra increase attenuation pulses when the signal is in quadrant 1 and extra decrease attenuation pulses in quadrant 3. Graph 300 shows how the gain/phase detector reacts to the DC offset when the input signal is in quadrant 1. Graph 600 shows the effects when the input is in quadrant 3. In both cases it is assumed that only DC errors are present. In other words it is assumed that gain and phase errors are zero. This assumption can be readily made because the adapter 212 provides such a condition. With zero gain and phase errors, vectors 319 (519) and 309 (509) should be identical. In graph 300, the DC error increases vector 309 such that it is longer than 319. The error signal 311, after subtracting 319 from 309 ends out in error quadrant 3 (FIG. 4). This is further documented in row 1, column 3 of the table 700 of FIG. 7 which shows that for quadrant 1 input and error quadrant 3 the gain/phase detector will increment attenuation.

In FIG. 5, the input signal is in quadrant 3. For the same positive I, positive Q DC offset, the vector 509 shrinks in length. The error signal 511 remains in error quadrant 3. Graph 600 and row 3, column 3 of table 700 shows that for quadrant 3 input and error quadrant 3, the gain/phase detector will decrement attenuation. The DC adapter monitors this dual condition and incrementally applies negative voltages to compensate the I and Q error signal.

FIG. 8 summarizes the operation of the DC adjust algorithm. It lists all 8 dual combinations of input quadrant and correction pulses that the DC adapter monitors. Column 5 of table 800 gives the appropriate response of the DC adapter to each of these conditions. For large DC errors, both I and Q thresholds are exceeded in opposite quadrants with opposite errors. It takes both conditions on one row of FIG. 8 before the correction pulses in column 5 are activated. Independent flip flops are used to look for each pair of events.

In the preferred embodiment, the corrections all run simultaneously. However, once one DC error has been driven to zero, the convergence for the other channel slows dramatically. To overcome this problem and in accordance with the present invention, when one DC error is driven to zero, that charmers thresholds are ignored. This is an obvious extension of the current invention and should not require further elaboration on the technique.

In summary, the digital DC correction circuit uses the digital outputs from the quadrant detector and the digital outputs from the gain/phase detector to determine incremental DC corrections for the gain/phase detector. A significant advantage of this circuit is that it does not require analog integrators which are realized using capacitors. Since capacitors need excessive space when integrated, their elimination is a great help in reducing the overall size and cost of the adaptive and DC correction circuits.

What is claimed is:

1. A radio frequency (RF) amplifier circuit coupled to a load, comprising:

a main amplifier loop capable of stabilizing an amplifier having a drive signal, without using an isolator; and an auxiliary loop coupled to the main amplifier loop and receiving a sample of the drive signal, the auxiliary loop comprising:

an adapter circuit for adapting the amplifier to changes in the impedance of the load, the adapter circuit having a Direct Current (DC) correction circuit for minimizing DC offsets in the main amplifier loop, the adapter circuit comprising:

a quadrant detector;

a gain detector, and a phase detector to determine incremental DC corrections in order to minimize DC offsets in the main amplifier loop.

2. A method for providing a linear transmitter, comprising:

providing an amplifier feedback loop for amplifying a signal;

detecting the magnitude of the signal;

establishing performance parameters for the amplifier feedback loop;

directing an adapter to alter the performance of the amplifier feedback loop when the magnitude of the signal is within a threshold;

detecting DC offsets in the amplifier feedback loop;

correcting DC offsets in the amplifier feedback loop; and adjusting the amplitude of the amplifier feedback loop to compensate for phase changes.

3. The method of claim 2, further including the step of establishing time gates associated with the magnitude of the signal.

4. A method for providing a linear transmitter, comprising:

providing an amplifier feedback loop for amplifying a signal;

detecting the magnitude of the signal;

establishing performance parameters for the amplifier feedback loop including calibrating the amplitude and phase of the linear transmitter;

directing an adapter to alter the performance of the amplifier feedback loop when the magnitude of the signal is within a threshold;

detecting DC offsets in the amplifier feedback loop; and correcting DC offsets in the amplifier feedback loop.

5. A method for minimizing performance degradation of a linear transmitter in the presence of antenna interferences, comprising:

providing a signal path including an amplifier closed loop;

coupling a first sample from the signal path to an automatic gain control (AGC);

coupling a second sample from the signal path to establish a first and a second time window;

linearly adapting the amplifier closed loop to operate optimally in the first time window including adapting the amplifier closed loop during a third time window to provide for optimum operation during the first time window;

directing the amplifier closed loop to operate with a predetermined amount of compression in the second time window;

detecting misadjustments in the amplifier closed loop; and correcting the misadjustments by eliminating DC offset associated with the amplifier closed loop adapting the amplifier closed loop.

6. The method claim 5, wherein the step of correcting includes removing Direct Current (DC) offsets from the first and second samples.

7. The method of claim 5, wherein the step of detecting includes estimating the level of DC offset.

8. A method for minimizing performance degradation of a linear transmitter in the presence of antenna interferences, comprising:

providing a signal path including an amplifier closed loop;

coupling a first sample from the signal path to an automatic gain control (AGC);

coupling a second sample from the signal path to establish a first and a second time window;

linearly adapting the amplifier closed loop to operate optimally in the first time window;

directing the amplifier closed loop during a third time window to operate with a predetermined amount of compression in the second time window;

detecting misadjustments in the amplifier closed loop and correcting the misadjustments by eliminating DC offset associated with the amplifier closed loop.

* * * * *